United States Patent [19]

Singh et al.

[11] Patent Number: 4,485,471

[45] Date of Patent: Nov. 27, 1984

[54] METHOD OF MEMORY RECONFIGURATION FOR FAULT TOLERANT MEMORY

[75] Inventors: Shanker Singh, Fishkill; Vijendra P. Singh, Poughkeepsie, both of N.Y.

[73] Assignee: International Business Machines Corporation, Armonk, N.Y.

[21] Appl. No.: 383,640

[22] Filed: Jun. 1, 1982

[51] Int. Cl.³ .................... G06F 11/00; G11C 13/00
[52] U.S. Cl. .................................. 371/2; 365/200; 371/11
[58] Field of Search ............... 371/2, 10, 11; 365/200

[56] References Cited

U.S. PATENT DOCUMENTS

| | | | |
|---|---|---|---|
| 3,644,902 | 2/1972 | Beausoleil | 365/200 |
| 3,781,826 | 12/1973 | Beausoleil | 365/200 |
| 3,812,336 | 5/1974 | Bossen et al. | 371/38 |
| 3,897,626 | 8/1975 | Beausoleil | 365/200 X |
| 4,074,236 | 2/1978 | Ishida | 365/200 |

OTHER PUBLICATIONS

Singh et al., Word Line, Bit Line Address Interchanging to Enhance Memory Fault Tolerance, IBM Technical Disclosure Bulletin, vol. 26, No. 6, Nov. 1983, pp. 2747-2748.

Ryan, Fault Realignment Through Grouping of Compatible Fault Memory Chips, IBM Tech. Discl. Bulletin, vol. 26, No. 6, Nov. 1983, pp. 2753-2754.

*Primary Examiner*—Charles E. Atkinson
*Attorney, Agent, or Firm*—James E. Murray

[57] ABSTRACT

Swapping of bits between different words of a memory is accomplished by reference to data on bad bits in the memory. This data controls address inputs to each bit in a memory word so that any word with multiple uncorrectable errors is changed to a correctable data word by placing one or more of the bad bits in the word into another word of the memory. The data is used in maintaining a list of preferred word address locations for bad bits. These preferred word locations are word addresses which contain less than a threshold level of faulty bit positions. As each faulty bit is permuted into one of these preferred word addresses, the list is updated to account for the new location of the permuted bit. Before being permuted, the actual physical memory address of a fault is used in making up the list. After permutation, the logical address of the faulty bit is used in changing the list. The process can involve categorizing of failures in accordance with type and performing algorithm operations which identify combinations of bit addresses that would result in combining the failures so that there are more errors in any memory word than would be correctable by the error correction code monitoring the memory.

6 Claims, 16 Drawing Figures

FIG. 2

| W/L Address | B1 | B2 | B3 | B4 | B5 | B6 | B7 | B8 | B9 | B10 | # of Errors |
|---|---|---|---|---|---|---|---|---|---|---|---|
| 0 | X | X |   |   |   |   |   |   |   |   | 2 |
| 1 |   |   |   |   |   |   |   |   |   |   |   |
| 2 |   | X | X |   |   |   |   |   |   |   | 2 |
| 3 |   |   | X | X |   |   |   |   |   |   | 2 |
| 4 |   |   |   |   |   |   |   |   |   |   |   |
| 5 |   |   |   |   |   |   |   |   |   |   |   |
| 6 |   |   |   |   | X | X | X |   |   |   | 3 |
| 7 |   |   |   |   |   |   |   |   |   |   |   |
| 8 |   |   |   |   |   |   |   |   |   |   |   |
| 9 |   |   | X |   |   | X |   | X |   |   | 3 |
| A | X |   |   |   |   |   |   |   |   |   | 1 |
| B |   |   |   |   |   |   |   |   |   |   |   |
| C |   |   |   |   | X | X |   |   |   |   | 2 |
| D |   |   |   |   |   |   |   |   |   |   |   |
| E |   |   |   |   |   | X |   |   |   |   | 1 |
| F |   |   |   |   |   |   |   |   |   |   |   |
| DISP. POSSIBILITY PT = | 1 | 2 | 3 | 1 | 2 | 3 | 1 | 1 | 0 | 0 |  |

FIG. 3

| W/L Address | B1 | B2 | B3 | B4 | B5 | B6 | B7 | B8 | B9 | B10 | Errors After Step 5 |
|---|---|---|---|---|---|---|---|---|---|---|---|
| 0 | X | X |   |   |   |   |   |   |   |   | 2 |
| 1 |   |   |   |   |   |   |   |   |   |   |   |
| 2 |   | X | X |   |   |   |   |   |   |   | 2 |
| 3 |   |   | X | X |   |   |   |   |   |   | 2 |
| 4 |   |   |   |   |   |   |   |   |   |   |   |
| 5 |   |   |   |   |   |   |   |   |   |   |   |
| 6 |   |   |   |   | X |   | X |   |   |   | 2 |
| 7 |   |   |   |   |   |   | X |   |   |   | 1 |
| 8 |   |   |   |   |   | X |   |   |   |   | 1 |
| 9 |   |   | X |   |   |   |   | X |   |   | 2 |
| A | X |   |   |   |   |   |   |   |   |   | 1 |
| B |   |   |   |   |   |   |   |   |   |   |   |
| C |   |   |   |   | X |   |   |   |   |   | 1 |
| D |   |   |   |   |   | X |   |   |   |   | 1 |
| E |   |   |   |   |   |   |   |   |   |   |   |
| F |   |   |   |   |   | X |   |   |   |   | 1 |
| After Step 5 PT= | 1 | 2 | 3 | 1 | 1 | 0 | 2 | 1 | 0 | 0 |   |

FIG. 4

| Address | W/L B/L B1 | B2 | B3 | B4 | B5 | B6 | B7 | B8 | B9 | B10 | Errors After Step 6 |
|---|---|---|---|---|---|---|---|---|---|---|---|
| 0 | X | X |   |   |   |   |   |   |   |   | 2 |
| 1 |   |   |   |   |   |   |   |   |   |   |   |
| 2 |   | X |   |   |   |   |   |   |   |   | 1 |
| 3 |   |   |   | X |   |   |   |   |   |   | 1 |
| 4 |   |   | X |   |   |   |   |   |   |   | 1 |
| 5 |   |   | X |   |   |   |   |   |   |   | 1 |
| 6 |   |   |   |   | X |   | X |   |   |   | 2 |
| 7 |   |   |   |   |   | X |   |   |   |   | 1 |
| 8 |   |   |   |   |   |   | X |   |   |   | 1 |
| 9 |   |   |   |   |   |   |   | X |   |   | 1 |
| A | X |   |   |   |   |   |   |   |   |   | 1 |
| B |   |   |   |   |   |   |   |   |   |   |   |
| C |   |   |   |   | X |   |   |   |   |   | 1 |
| D |   |   |   |   |   | X |   |   |   |   | 1 |
| E |   |   | X |   |   |   |   |   |   |   | 1 |
| F |   |   |   |   |   | X |   |   |   |   | 1 |
| After Step 6 PT= | 1 | 1 | 0 | 0 | 1 | 0 | 1 | 0 | 0 | 0 |   |

FIG.5

| W/L Address | B1 | B2 | B3 | B4 | B5 | B6 | B7 | B8 | B9 | B10 | Errors After Step 7 |
|---|---|---|---|---|---|---|---|---|---|---|---|
| 0 | X |   |   |   |   |   |   |   |   |   | 1 |
| 1 |   | X |   |   |   |   |   |   |   |   | 1 |
| 2 |   |   |   |   |   |   |   |   |   |   |   |
| 3 |   | X |   | X |   |   |   |   |   |   | 2 |
| 4 |   |   | X |   |   |   |   |   |   |   | 1 |
| 5 |   |   | X |   |   |   |   |   |   |   | 1 |
| 6 |   |   |   |   | X |   | X |   |   |   | 2 |
| 7 |   |   |   |   |   | X |   |   |   |   | 1 |
| 8 |   |   |   |   |   | X |   |   |   |   | 1 |
| 9 |   |   |   |   |   |   |   | X |   |   | 1 |
| A | X |   |   |   |   |   |   |   |   |   | 1 |
| B |   |   |   |   |   |   |   |   |   |   |   |
| C |   |   |   |   | X |   |   |   |   |   | 1 |
| D |   |   |   |   |   | X |   |   |   |   | 1 |
| E |   |   | X |   |   |   |   |   |   |   | 1 |
| F |   |   |   |   |   | X |   |   |   |   | 1 |
| After Step 7 PT= | 0 | 1 | 0 | 1 | 1 | 0 | 1 | 0 | 0 | 0 |   |

FIG. 6

| W/L Address | B/L B1 | B2 | B3 | B4 | B5 | B6 | B7 | B8 | B9 | B10 | Errors After Step 8 |
|---|---|---|---|---|---|---|---|---|---|---|---|
| 0 | X | | | | | | | | | | 1 |
| 1 | | X | | | | | | | | | 1 |
| 2 | | | | X | | | | | | | 1 |
| 3 | | X | | | | | | | | | 1 |
| 4 | | | X | | | | | | | | 1 |
| 5 | | | X | | | | | | | | 1 |
| 6 | | | | | X | | | | | | 1 |
| 7 | | | | | | X | | | | | 1 |
| 8 | | | | | | X | | | | | 1 |
| 9 | | | | | | | | X | | | 1 |
| A | X | | | | | | | | | | 1 |
| B | | | | | | | X | | | | 1 |
| C | | | | X | | | | | | | 1 |
| D | | | | | | X | | | | | 1 |
| E | | | X | | | | | | | | 1 |
| F | | | | | | X | | | | | 1 |
| After Step 8 PT= | 0 | 0 | 0 | 0 | 0 | 0 | 0 | 0 | 0 | 0 | |

FIG. 9

| SECTION PAIRS WITH POSSIBLE CONFLICT | PERMUTABLE ADDRESS PAIR | ADDRESS WITHIN CHIPS (WRDLINE;BITLINE) | POSSIBLE ALIGNMENT FAULT TYPES | # OF ERROR DUE TO NON-AVAILABILITY OF FAULT ADDR. |
|---|---|---|---|---|
| 14,28 | 13, 9 | [(53,0); (53,52)] | WRDLINE X CELL | 1 |
| 14,47 | 31,16 | [(211,199);(211,0)] | CELL X WRDLINE | 1 |
| 14,48 | 31,13 | [(199,211);(199,0)] | CELL X WRDLINE | 1 |
| 16,20 | 14, 3 | [(107,0);(107,0)] | WRDLINE X WRDLINE | 256 |
| 20,28 | 3, 3 | [(107,0);(107,0)] | WRDLINE X WRDLINE | 256* |
| 16,28 | 14, 3 | [(107,0);(107,0)] | WRDLINE X WRDLINE | 256 |
| 21,28 | 20,23 | [(223,86);(223,0)] | CELL X WRDLINE | 1 |
| 29,40 | 13,28 | [(213,0);(213,75)] | WRDLINE X CELL | 1 |
| 41,65 | 24,11 | [(253,150);(253,0)] | CELL X WRDLINE | 1 |
| 60,65 | 1,11 | [(253,245);(253,0)] | CELL X WRDLINE | 1 |
| 65,71 | 0,17 | [(200,0);(200,153)] | WRDLINE X CELL | 1 |

\* # OF ERRORS IN MEMORY DUE TO 2 WRDLINES HAVING SAME ADDRESS BEFORE FAULT ALIGNMENT EXCLUSION

FIG. 40

| SECTION PAIRS WITH POSSIBLE CONFLICT | PERMUTABLE ADDRESS PAIR | PERMUTATION VECTOR FOR FIRST SEC IN PAIR | PERMUTATION VECTOR EXCLUDED IN SECOND SEC IN PAIR | COMMENTS |
|---|---|---|---|---|
| 14,28 | 13, 9 | p1* | (p1 + 4) | 13 + 9 = 4 |
| 14,47 | 31,16 | p1 | (p1 + 15) | 31 + 16 = 15 |
| 14,48 | 31,13 | p1 | (p1 + 18) | 31 + 13 = 18 |
| 16,20 | 14, 3 | p2 | (p2 + 13) | 14 + 3 = 13 |
| 16,28 | 14, 3 | p2 | (p2 + 13) | 14 + 3 = 13 |
| 20,28 | 3, 3 | 0 | ( 0 + 0) | 3 + 3 = 0 |
| 21,28 | 20,23 | 0 | ( 0 + 3) | 20 + 23 = 3 |
| 29,40 | 13,28 | p3 | (p3 + 17) | 13 + 28 = 17 |
| 41,65 | 24,11 | p4 | (p4 + 19) | 24 + 11 = 19 |
| 60,65 | 1,11 | 0 | ( 0 + 10) | 1 + 11 = 10 |
| 65,71 | 0,17 | p5 | (p5 + 17) | 0 + 17 = 17 |

FIG. 11

| ADDRESSES | FAULTS | CHIP BIT | | WORD CELL | | ERRORS |
|---|---|---|---|---|---|---|
| 0 | 3 | 0 | 0 | 2 | 1 | 0 |
| 1 | 4 | 0 | 0 | 1 | 3 | 0 |
| 2 | 2 | 0 | 0 | 0 | 2 | 256 |
| 3 | 3 | 0 | 2 | 0 | 1 | 0 |
| 4 | 1 | 0 | 1 | 0 | 0 | 0 |
| 5 | 4 | 0 | 0 | 1 | 3 | 257 |
| 6 | 3 | 1 | 0 | 0 | 1 | 0 |
| 7 | 3 | 0 | 0 | 0 | 3 | 0 |
| 8 | 2 | 0 | 1 | 0 | 1 | 0 |
| 9 | 6 | 1 | 1 | 1 | 4 | 260 |
| 10 | 4 | 0 | 0 | 0 | 3 | 0 |
| 11 | 4 | 0 | 2 | 0 | 2 | 0 |
| 12 | 2 | 0 | 0 | 0 | 1 | 2 |
| 13 | 4 | 0 | 2 | 1 | 3 | 0 |
| 14 | 3 | 0 | 1 | 0 | 1 | 0 |
| 15 | 5 | 0 | 2 | 0 | 3 | 259 |
| 16 | 6 | 1 | 1 | 0 | 3 | 772 |
| 17 | 1 | 1 | 1 | 0 | 2 | 0 |
| 18 | 2 | 0 | 1 | 2 | 0 | 0 |
| 19 | 1 | 0 | 0 | 0 | 2 | 0 |
| 20 | 3 | 0 | 0 | 0 | 4 | 0 |
| 21 | 2 | 0 | 0 | 0 | 1 | 0 |
| 22 | 2 | 0 | 0 | 0 | 3 | 256 |
| 23 | 3 | 1 | 1 | 1 | 1 | 0 |
| 24 | 4 | 0 | 0 | 0 | 0 | 0 |
| 25 | 1 | 1 | 0 | 1 | 2 | 3 |
| 26 | 2 | 0 | 0 | 0 | 3 | 0 |
| 27 | 3 | 0 | 0 | 0 | 1 | 0 |
| 28 | 2 | 0 | 0 | 0 | 1 | 0 |
| 29 | 2 | 0 | 0 | 0 | 2 | 0 |
| 30 | 2 | 0 | 1 | 0 | 3 | 0 |
| 31 | 7 | 0 | 1 | 0 | 6 | 0 |
| TOTAL | 98 | 6 | 18 | 12 | 62 | 1809 + 256 = 1865 |

FIG. 13

| ADDRESSES | FAULTS | CHIP BIT | | WORD CELL | | ERRORS |
|---|---|---|---|---|---|---|
| 0 | 4 | 0 | 0 | 2 | 2 | 0 |
| 1 | 4 | 0 | 0 | 1 | 3 | 0 |
| 2 | 2 | 0 | 0 | 0 | 2 | 0 |
| 3 | 5 | 0 | 1 | 0 | 4 | 0 |
| 4 | 3 | 0 | 2 | 0 | 1 | 0 |
| 5 | 6 | 0 | 0 | 3 | 3 | 0 |
| 6 | 1 | 0 | 1 | 0 | 1 | 0 |
| 7 | 3 | 0 | 2 | 0 | 2 | 0 |
| 8 | 3 | 0 | 0 | 0 | 1 | 0 |
| 9 | 1 | 0 | 0 | 0 | 0 | 0 |
| 10 | 4 | 1 | 2 | 2 | 2 | 0 |
| 11 | 4 | 0 | 0 | 0 | 2 | 0 |
| 12 | 2 | 0 | 2 | 0 | 0 | 0 |
| 13 | 1 | 0 | 0 | 0 | 1 | 0 |
| 14 | 7 | 1 | 2 | 0 | 5 | 0 |
| 15 | 0 | 0 | 0 | 0 | 0 | 0 |
| 16 | 5 | 0 | 3 | 0 | 2 | 0 |
| 17 | 3 | 0 | 1 | 0 | 2 | 0 |
| 18 | 1 | 1 | 0 | 0 | 0 | 0 |
| 19 | 2 | 0 | 0 | 0 | 2 | 0 |
| 20 | 1 | 0 | 0 | 0 | 1 | 0 |
| 21 | 5 | 1 | 0 | 0 | 4 | 0 |
| 22 | 1 | 0 | 0 | 0 | 0 | 0 |
| 23 | 7 | 0 | 0 | 2 | 5 | 0 |
| 24 | 3 | 1 | 0 | 0 | 3 | 0 |
| 25 | 1 | 0 | 0 | 0 | 0 | 0 |
| 26 | 2 | 0 | 0 | 0 | 1 | 0 |
| 27 | 3 | 0 | 1 | 1 | 3 | 0 |
| 28 | 4 | 0 | 0 | 0 | 3 | 0 |
| 29 | 4 | 0 | 2 | 0 | 2 | 0 |
| 30 | 4 | 0 | 1 | 0 | 3 | 0 |
| 31 | 5 | 0 | 1 | 0 | 4 | 0 |
| TOTAL | 98 | 6 | 18 | 12 | 62 | 0 |

FIG.15

| ADDRESSES | FAULTS | CHIP BIT | CHIP BIT | WORD CELL | WORD CELL | ERRORS |
|---|---|---|---|---|---|---|
| 0 | 4 | 0 | 0 | 2 | 2 | 0 |
| 1 | 4 | 0 | 0 | 1 | 3 | 0 |
| 2 | 2 | 0 | 0 | 0 | 2 | 0 |
| 3 | 5 | 0 | 1 | 0 | 4 | 0 |
| 4 | 3 | 0 | 2 | 0 | 1 | 0 |
| 5 | 6 | 0 | 0 | 3 | 3 | 0 |
| 6 | 1 | 0 | 0 | 0 | 1 | 0 |
| 7 | 3 | 0 | 1 | 0 | 2 | 0 |
| 8 | 3 | 0 | 2 | 0 | 1 | 0 |
| 9 | 1 | 1 | 0 | 0 | 0 | 0 |
| 10 | 4 | 0 | 0 | 2 | 2 | 0 |
| 11 | 4 | 0 | 2 | 0 | 2 | 0 |
| 12 | 2 | 1 | 0 | 0 | 0 | 0 |
| 13 | 1 | 0 | 0 | 0 | 5 | 0 |
| 14 | 7 | 0 | 2 | 0 | 0 | 0 |
| 15 | 0 | 0 | 0 | 0 | 2 | 0 |
| 16 | 5 | 0 | 3 | 0 | 3 | 0 |
| 17 | 4 | 1 | 1 | 0 | 0 | 0 |
| 18 | 1 | 0 | 0 | 0 | 2 | 0 |
| 19 | 2 | 1 | 0 | 0 | 0 | 0 |
| 20 | 1 | 0 | 0 | 0 | 1 | 0 |
| 21 | 1 | 0 | 0 | 2 | 4 | 0 |
| 22 | 6 | 1 | 0 | 0 | 0 | 0 |
| 23 | 1 | 0 | 0 | 1 | 5 | 0 |
| 24 | 5 | 0 | 0 | 0 | 3 | 0 |
| 25 | 3 | 1 | 0 | 0 | 0 | 0 |
| 26 | 1 | 0 | 0 | 0 | 1 | 0 |
| 27 | 2 | 0 | 1 | 0 | 3 | 0 |
| 28 | 3 | 0 | 0 | 1 | 3 | 0 |
| 29 | 4 | 0 | 0 | 0 | 2 | 0 |
| 30 | 4 | 0 | 2 | 0 | 3 | 0 |
| 31 | 4 | 0 | 1 | 0 | 3 | 0 |
| TOTAL | 98 | 6 | 18 | 12 | 62 | 0 |

METHOD OF MEMORY RECONFIGURATION FOR FAULT TOLERANT MEMORY

BACKGROUND OF THE INVENTION

The present invention relates to the automatic skewing of addresses in a memory to change memory words with uncorrectable errors into memory words with errors that can be corrected by the error correction code protecting the memory.

Error correction and detection schemes for encoding data are known to detect more errors than they are capable of correcting. For instance, a 64 data bit word can be provided with a single error correction and a double error detection capability by using eight check bits which are stored on the same word location in memory as the 64 data bits. A failure of any single one of the 72 cells which store the data and check bits can be corrected by error correcting circuitry. This same circuitry can also be used to detect double errors existing in the word but generally will not correct these double errors. That is, if a single bit fails the particular defective bit can be identified and, therefore, corrected. However, if two bits fail the occurrence of the failure can be detected but the failing bits generally cannot be pinpointed and, therefore, cannot be corrected.

The term "generally" has been used in connection with double error correction because some of the single error correction codes do correct specific types of double errors such as errors in adjacent bit positions. However, not all double errors will occur in a correctable pattern. Therefore, to repeat what has already been said, an error correction system generally speaking will detect a greater number of errors than it has the capability of automatically correcting.

To take advantage of this capacity of an error correction code to detect more errors than it can correct, Beausoleil U.S. Pat. No. 3,644,902 suggests a means for changing errors that are detectable but uncorrectable into errors that are both detectable and correctable. In the Beausoleil patent, a memory unit is made up of a plurality of arrays each containing all the bits for one bit position in the memory unit. These arrays are each addressed through a decoder so that the proper bit of any word is selected from each array when the word is addressed. The Beausoleil patent suggests that, when multiple errors are to be avoided, circuitry be employed that permanently modifies the address supplied to the decoders to swap bits between words by physically wrapping the arrays and thereby change words with uncorrectable errors into words with correctable errors.

In Bossen et al U.S. Pat. No. 3,812,336, and in an article entitled "Address Reconfiguration for Large-Scale Integrated Memory Yield Inducement", appearing on page 1245 of the September 1973 issue of the IBM Technical Disclosure Bulletin, an address modification scheme was proposed to form electronic swapping of memory bits. In this scheme the address supplied to the decoder of any particular bit array is modified by logic circuitry as a function of data stored in a shift register associated with the particular bit position of the words in the memory unit. The logic circuitry controlled by each of the registers includes an Exclusive OR gate for each of the inputs of the decoder of the particular bit position. Each of the Exclusive OR gates accepts one digit of the word address and the output of one of the stages of the linear feedback shift register and supplied its output to one of the inputs of the decoder. In the IBM Technical Disclosure Bulletin article, the decoder input address of the bad bit is placed in the shift register so that when the bad bit is requested bit location 0 is accessed instead. In the Bossen et al patent, a different Galois field number is stored in each of the shift registers starting with zero in the shift register of the first bit position and proceeding in the Galois field number sequence to the highest number needed in the shift register of the last bit position. Each time a multiple error is detected, each of the shift registers, except the shift register for the first bit position, is shifted one Galois number. This assures that the detected multiple error will be eliminated by scattering the bits making up the failing word. As a result of this scattering, each of the falling bits end up in a different word changing the uncorrectable multiple error condition into a number of correctable single error conditions.

Test results pointing to the location of bad bits are used in Beausoleil Pat. Nos. 3,781,826 and 3,897,626 to divide chips into groups in accordance with the location of the failing bits. In U.S. Pat. No. 3,897,626, these chips are mounted on memory cards with all chips having a defective chip in a given chip section being mounted on a corresponding section of a card. The address wiring is then used to skew the errors so that no memory word contains more than one bad bit. If a failure is detected by an ECC system, an Exclusive ORing of two sections of the address of the failing word will locate the bad or suspicious bit.

In U.S. patent application Ser. No. 362,925, filed Mar. 29, 1982 and entitled "Deterministic Permutation Algorithm", the swapping of bits between different words of a memory is accomplished by using data on bad bits in the memory. The permutation of the bit addresses is done by an exclusionary process which identifies address combinations which result in alignment of bit failures that are uncorrectable by the error correction system of the memory and then limiting the selection process to other combinations. In the preferred embodiment, failures are categorized by type, such as chip, line or bit failure to determine uncorrectable combinations of failures. The bit addresses are then permuted in order of decreasing number of failures.

BRIEF DESCRIPTION OF THE INVENTION

In accordance with the present invention, the swapping of bad bits between different words of a memory is accomplished by a new process using data on bad bits in the memory. In the mentioned U.S. patent application, Ser. No. 362,925, the exclusionary process that selects address locations for bad bits of any bit position takes into account only the bit positions that have already had their addresses permuted. In the present arrangement, consideration is also given to data on bit failures in bit positions yet to be permuted. This is done by maintaining a list of "preferred word address locations" for the insertion of bad bits. A preferred word location in one which at that moment contains a less than a threshold level of faulty bit positions. As each faulty bit is permuted into one of these preferred word address locations, the list is changed to take into account the placement of the bad bit. Up until permutation, the unpermutted or actual physical address of a bad bit is used in calculating the list. After being permuted the logical memory address is used in changing the list.

Therefore, it is an object of the present invention to provide a scheme for swapping bits in memory words to change uncorrectable error conditions into correctable error conditions.

It is another object of the present invention to swap bits in memory words using fault data on bad cells in the memory.

An additional object of the invention is to swap bits in memory words based on known error conditions existing in the memory categorized by the type of error.

THE DRAWINGS

These and other objects of the present invention can be best understood by reference to the figures of the drawings of which:

FIGS. 2 to 6 are diagramatic representations of a set of faults in the memory of FIG. 1 prior to, during and after completion of the rearrangement process of the present invention.

FIGS. 8 to 15 are diagrammatic and tabular representations of a second set of faults prior to and after the rearrangement of faults in accordance with the present invention.

DETAILED DESCRIPTION OF THE INVENTION

Figure 1:
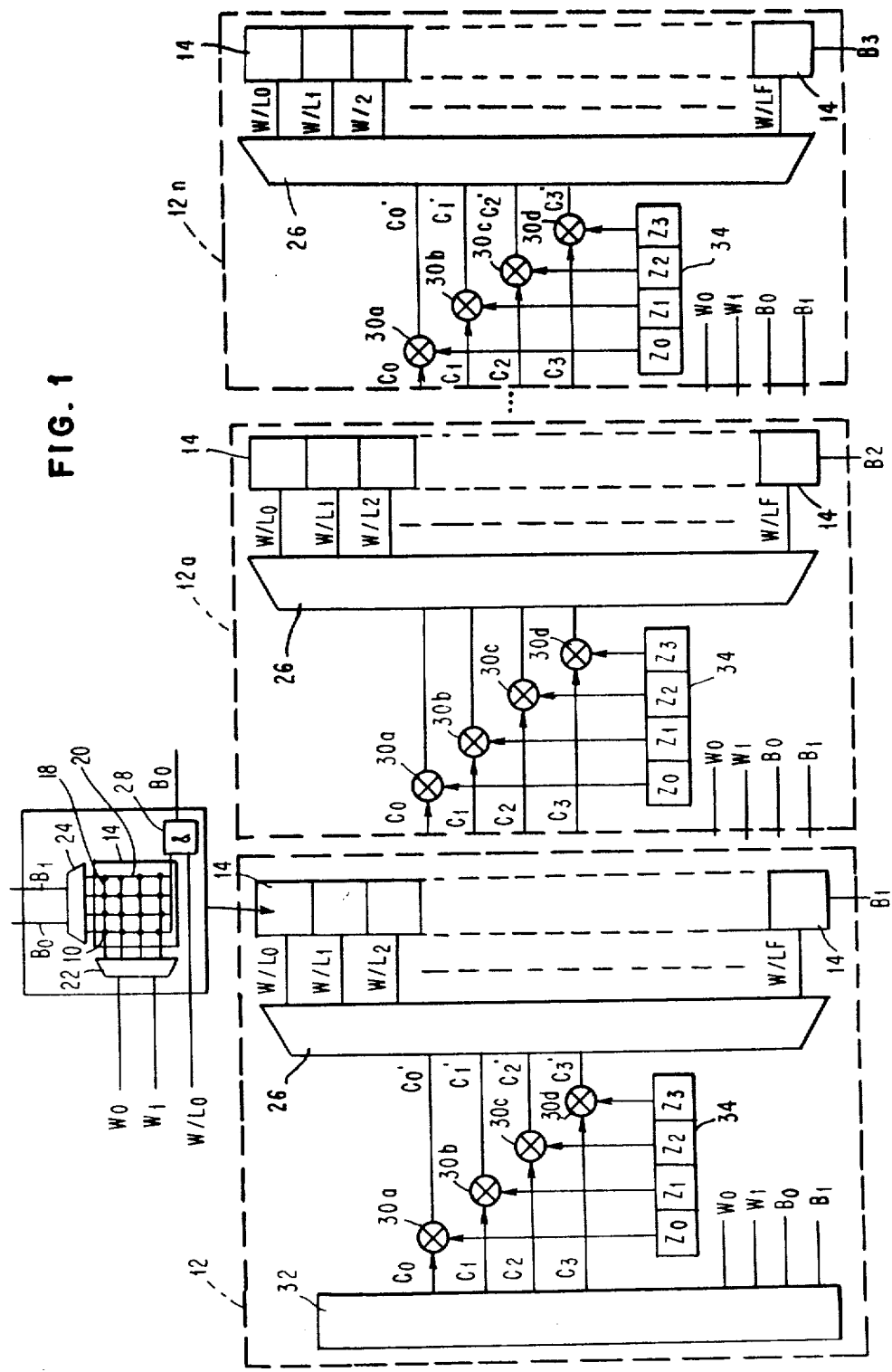
FIG. 1 is a schematic of a memory employing the present invention.

As shown in FIG. 1, the storage cells 10 of each bit position $B_1$ to $B_{72n}$ of a plurality of 72 bit memory words are each arranged in separate identical cards 12 in a plurality of arrays or bit islands 14. The arrays 14 are 16 bit arrays with each bit 10 located at a different intersection of one of four word lines 18 with one of four bit lines 20. The arrays 16 are each accessed thru a different word decoder 22 and bit decoder 24 which receive identical 2 bit address signals $W_0$, $W_1$ and $B_0$, $B_1$ respectively.

In addition to a word and bit decoder associated with each array each card 12 also contains a chip decoder 26 which receives a 4 bit address $C_0'$, $C_1'$, $C_2'$, $C_3'$. The bit decoder selects the output of one of the sixteen arrays 14 on each card 12.

The chip address bits $C_0'$, $C_1'$, $C_2'$ and $C_3'$ are each the output of an Exclusive OR circuit 30 that receives one address input $C_0$, $C_1$, $C_2$ or $C_3$ from the address register 32 and another input $Z_0$, $Z_1$, $Z_2$ or $Z_3$ from a different stage of a shift register 34. Therefore, if $Z_0$ to $Z_3$ are all zero, the chip decoder 26 will access the memory bit island requested by the address register 32. With any other binary combination $Z_0$ to $Z_3$ in the shift register 34, the chip decoder 26 will access one of the other fifteen arrays.

To summarize then, the memory address register transmits the same six address bits $C_0$, $C_1$, $C_2$, $C_3$, $W_0$, $W_1$, and $B_0$, $B_1$ to all cards 12a to 12n. In each card 12 address bits $W_0$, $W_1$ and $B_0$, $B_1$ access the same cell 10 in sixteen different arrays 14. The address bits $C_0'$, $C_1'$, $C_2'$, $C_3'$, select the output of one of those chips on each card to be read out as one of the bits $B_1$ to $B_{72}$ of the accessed word. If $Z_0$, $Z_1$, $Z_2$ and $Z_3$ are all zero, this will be the same bit position in the same array on all cards. If the register 34 on any card contains data other than zeros, the bit output $B_1$ of that card will be a bit in the same position on another array 14 of the card.

In accordance with the present invention, the data placed in the register 34 is selected by a new procedure on the basis of stored information on defects or faults of the chips. Rather than describing the process in general abstract terms, we will illustrate it with the help of an example in a step by step fashion. Consider the fault map of FIG. 2 showing faults existing in the first 10 bit positions of the memory of FIG. 1. For purposes of the following explanation, it will be assumed that the remaining bit positions in the memory are error free. The faulty arrays or islands 14 are labeled X. We find that from a total of sixteen island words two words contain 3 bit errors, 4 words contain 2 bit errors, 2 words contain 1 bit error and 8 words do not contain any error. Let us assume that this memory is equipped with SEC/DED capability. Since there are any 8 words W/L without errors, it is possible that bad bits from the words with 3 and 2 bit errors, can be dispersed into those errorless words.

Step 1. Identify all the bit sections according to their maximum error dispersion possibility ($P_T$); i.e., if we are successful in finding a suitable permutation vector, this is the maximum number of errors which can be dispersed. For example, if we can permute section B3 successfully, there is a potential that word lines 2 and 3 will have only single errors and word line 9 will have been left with 2 bit errors instead of 3. Therefore, section B3 has a maximum error dispersion possibility value equal to 3. Similarly, in section B6 (column B6), although there are 4 faults, with a suitable permutation vector one can disperse at the most, 3 errors. In this example, we find that sections B3, B6, B2, B5, B1, B4, B7 and B8 when permuted can potentially remove 3, 3, 2, 2, 1, 1, 1 and 1 error alignments respectively.

Step 2. Identify all the word addresses with zero error; i.e., word addresses 1, 4, 5, 7, 8, B, D and F.

Step 3. Also identify all word addresses corresponding to sections which have single error/section, i.e., word addresses 3, 6, and 9; since sections B4, B7 and B8 have only single error in word address 3, 6, and 9. These are defined as "Don't care word addresses" which can be gainfully used during any following iteration steps in the algorithm for finding mutually compatible permutation vectors.

Step 4. Choose a section with maximum error dispersion possibility. In our example, these are sections B3 and B6. Choose any one of these two sections. Let it be section B6. Identify faulty word addresses in section B6, (i.e., word addresses 6, 9, C and E).

Step 5. EXOR each error address in section B6 with word addresses having zero error identified in step 2 and "don't care" addresses identified in step 3. Choose a mutually compatible permutation vector from the vectors obtained by EXORing. If a completely compatible vector is not found, try to make use of "don't care" permutation vector set.

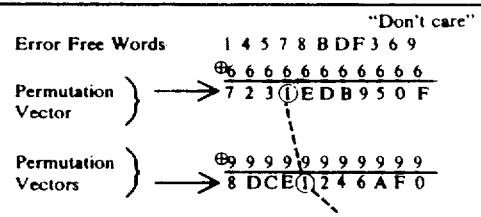

-continued

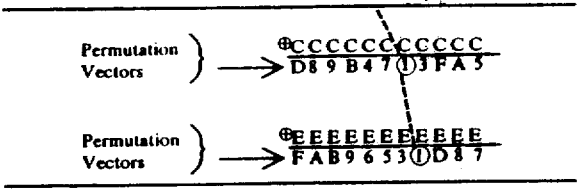

Suppose even "don't care" set does not help, then choose any permutation vector which removes the maximum number of error alignments. For example, suppose completely compatible permutation vector such as "1" not available, then a selection of a permutation vector from the vector set of 3, 9, B would be a suitable choice. Either of them can disperse error alignments in 2 words.

Here we found vector 1 which is able to disperse all 3 errors. While accomplishing this, the error free words 7, 8, D, and F now contain single bit error. Since there was only a single error in address E, this single error moves to address F leaving word E error free. Memory map after permuting addresses in section 6 is shown in FIG. 3 with updated $P_T$ and errors in words.

Step 6. Now we proceed with the next section (column) with maximum error dispersion possibility ($P_T$) and repeat the procedure described in step 5 with the remaining error free word addresses. The reader should note that step 5 may change the value of maximum error dispersion possibility; therefore, the next section must be chosen on the basis of updated value of $P_T$. We find it is section B3. Faulty words in section B3 are 2, 3 and 9.

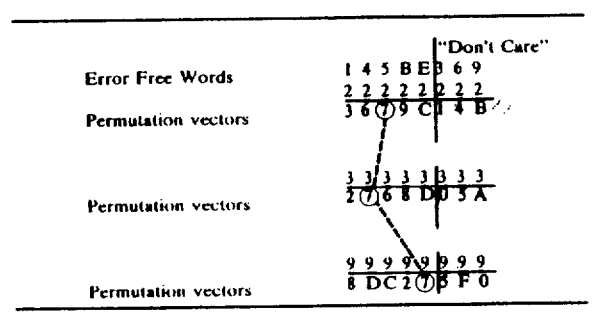

Here we find a mutually compatible permutation vector 7, which is able to disperse 3 errors. In the process of doing so, we use error free words 4, 5, and E. The updated error map with $P_T$ is shown in FIG. 4.

Step 7. Now we find that maximum error dispersion possibility $P_T$ of each remaining sections B1, B2, B5, and B7 is 1. In this situation, it is preferable to work with sections with a minimum number of faults. Since sections B1 and B2 have 2 faults, one can choose any section. Let us choose section B2. Faulty words in section B2 are 0 and 2. Repeating once again as in step 6 with remaining error free words 1 and B we have:

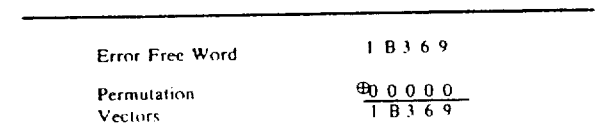

-continued

Here we take advantage of "Don't care" addresses to choose permutation vector 1. Although it disperses one error and at the same time adds 1 error, the new error can be dispersed by choosing section B4 with single fault which can be displaced to whatever error free word address is available. One can also choose permutation vector 3, 9, or B to provide an acceptable situation.

Step 8. Finally, since section B7 has only one fault and it combines with the fault in section B5 with 2 faults, section B7 is the next suitable section to work with. The selection of permutation vector is the same as for section B2 described in step 7.

Therefore, the complete set of permutation vectors which will disperse all the errors is as follows:

| SECTION | PERMUTATION VECTORS |
|---------|---------------------|
| B2 | 1 |
| B3 | 7 |
| B4 | 1 |
| B6 | 1 |
| B7 | D |

Figure 7:
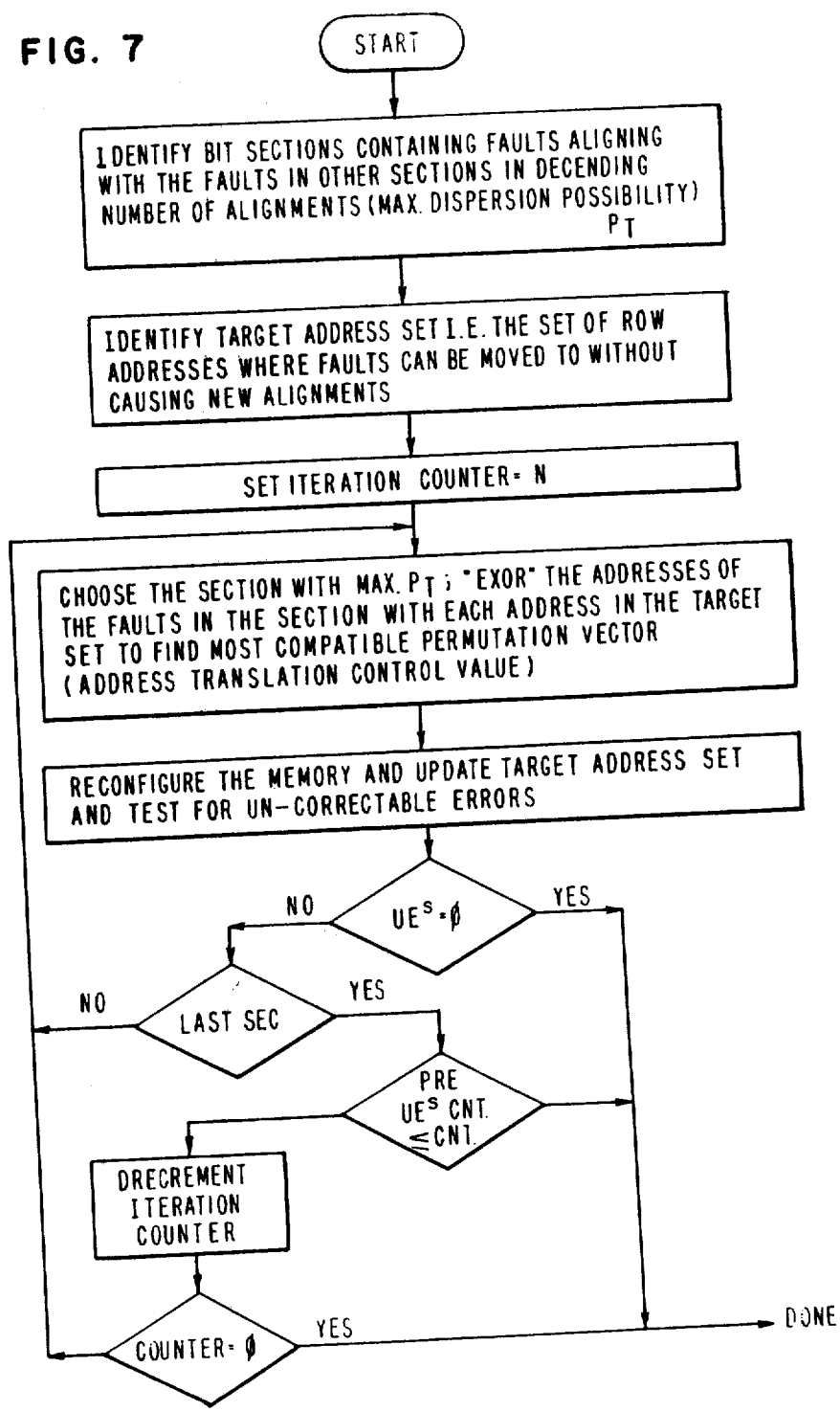
FIG. 7 is a flow diagram for rearranging uncorrectable errors in accordance with the present invention.

The reader should note that in step 7, if we had chosen section B1 instead of section B2, then permutation vector 1 would have been found to be mutually compatible without the need for don't care addresses. The permutation vector 1 for section B1 would have permuted errors in word 0 and A to 1 and B words, thereby, leaving section B4 as it was. The final memory map is shown in FIG. 6, where all multi-bit errors have been dispersed. FIG. 7 is a flow diagram of the algorithm that has just been described. An APL program embodying the algorithm is attached to the back of the Specification.

The algorithm has been described in connection with a memory equipped with single error connection double error detection (SEC/DED) capability. FIG. 7 is a flow diagram for the algorithm. It can also be used to disperse errors in a memory equipped with a double error detection triple error detection (DEC/TED) capability. For DEC/TED equipped memory, one must identify error words with three or more error addresses. The address permutation is then used to disperse those errors into words with 0 or 1 errors. Permutation is done in the order determined by the highest value of updated $P_T$ as explained earlier in this report.

The above description of the present illustration was done without regard to the type of fault that has occurred in the arrays 14. That is, the faults were not characterized as to whether they were bit failures, line failures or array failures. In the description of the invention in connection with FIG. 8 to the type of fault will be categorized and will be applied to a more complex memory. The memory consists of eighteen cards, each card being populated with 128, 65K bit chips. These chips are placed as 32×4 array on each card. Each card contributes four bits to each 72 bit wide memory word available to the system, thereby providing 2 million, 72-bit memory words (Base Storage Module BSM). However, from error dispersion logic implementation view point, the memory can be visualized as made up of 72 sections. Each section is equipped with its own independent address translation logic of five EX-OR gates and five latches. This logic is wired in such a fashion that the addressing bits which identify 32 chip rows can be translated according to the values of permutation bits stored earlier in the latches.

Figure 8:
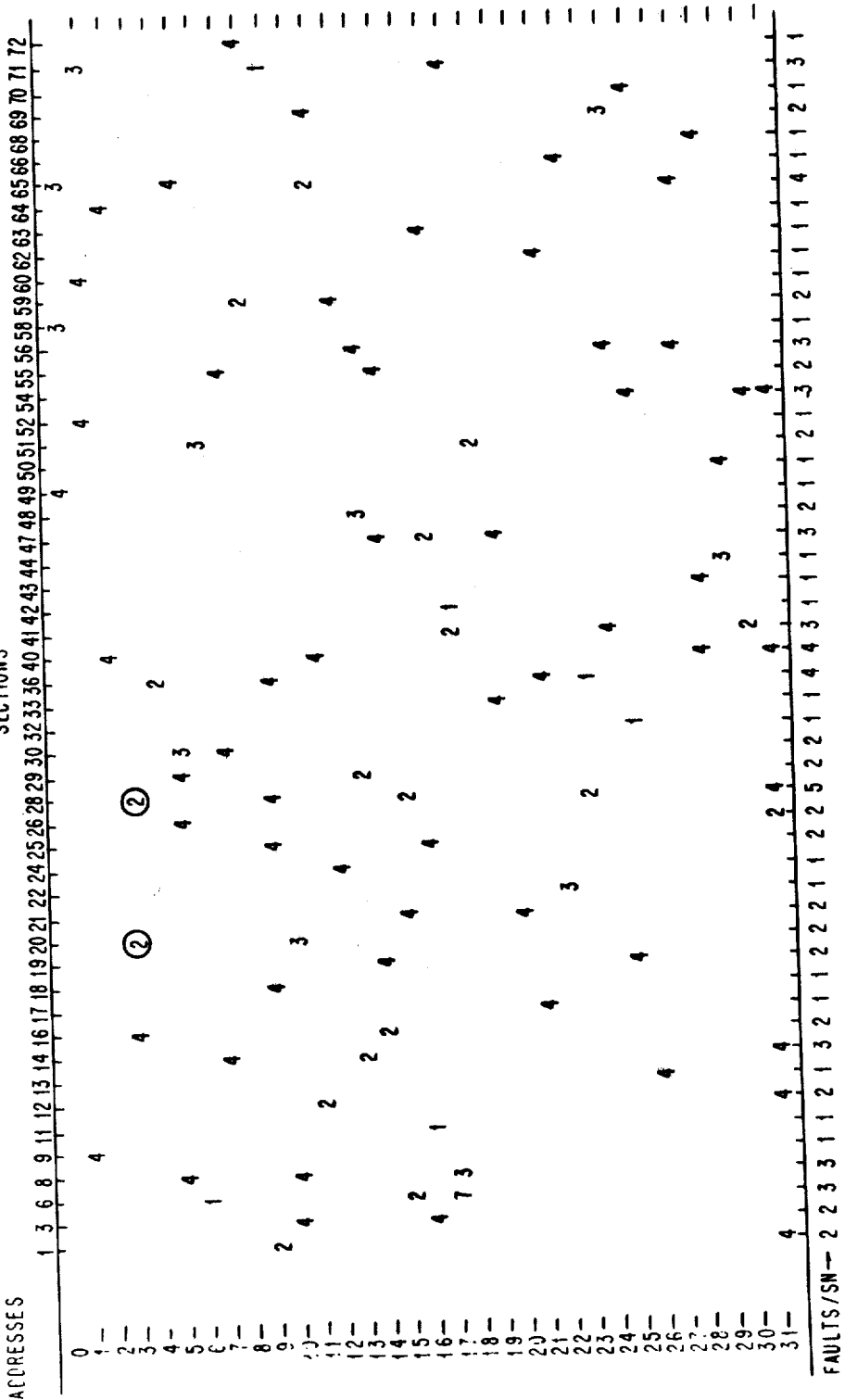

FIG. 8 represents the fault map for the memory. In general, the memory consists of 32×K matrix where K is the number of chip sections (columns) which contain at least (one) faulty array. In the example of FIG. 8, there are 52 sections with faulty arrays. The fault type in each section can be a complete chip kill, one or more bit line kill, one or more word line kill or one or more cell kill or the combination of bit line, word line and cell kill type faults. Whenever the occurrence of such faults in two or more sections results in the alignment, of chip faults to cause two or more bit errors per memory word can occur. The objective of address translation is to avoid such fault alignments and to provide a configuration where two or more bit faults can be avoided. Entries '0', '1', '2', '3'. and '4' in FIG. 8 represents 'no fault', 'chipkill', 'bit line kill', 'word line kill' and 'cell kill' type faults respectively. Entries such as 5, 6, 7 and 9 represents multiple fault type situations. For example, 5 implies a chip containing a failed bit line and a word line, while 7 represents a chip containing a failed word line and a cell kill. The actual addresses of a faulty bit line, word line and cell along with the information available in the fault map such as shown in FIG. 8 is called a complete fault map.

The error dispersion algorithm will now be described in a step by step fashion, by using a complete fault map. The algorithm will then be applied to a partial fault map.

Let us assume the availability of a complete fault map, i.e., fault data such as shown in FIG. 8 and summarized in FIG. 9. Although address of every fault type in each chip is available, in FIG. 8 only addresses of faults must be further taken into account by the algorithm are tabulated in FIG. 9. This is because only these faults can potentially cause alignments due to their identical "addresses" or "address components". FIG. 10 lists the permutation vectors which must be excluded in case the algorithm randomly select them from various available choices. For example, if algorithm chooses a vector p1 for section 14, then permutation vector (p+4) should be excluded while selecting a vector for section 28. Otherwise, the word line kill in row address 13 will align with cell kill in row address 9 after fault dispersion and thereby will cause one word to contain a two bit error.

FIG. 11 represents the Initial Error Summary Table which is basically extracted from FIG. 8 and FIG. 9. It consists of 32 row addresses and seven columns. First column represents the number of faults in each row address. The 2nd, 3rd, 4th and 5th columns represent the number of chip, bit line, word line and call kill faults for each row address. Column 7 indicates the number of memory words which have two or more bit errors. The circled entries represent the faults with identical address and thereby causing fault alignment. For example in row address 3, sections 20 and 28 have two chips with faulty bit lines whose addresses are identical and therefore produce 256 memory words each having two bit errors.

Step 1. With the help of FIGS. 8, 9 and 10 first extract the "work matrix", i.e., only those sections which cause fault alignments and thus produce two or more bit error memory words. For example, in row address 17, a chip kill in section 42 aligns with chips in sections 6, 8, 41 and 71, which have (word line+cell) fail, a word line fail, bit line fail and a cell fail respectively. These fault alignments cause 772 memory words with two or more bit errors. Therefore, sections 6, 8, 41, 42 and 71 are included in the work matrix.

In the memory example, the word matrix is a 32×24 matrix of the following sections:

1, 3, 6, 8, 11, 14, 18, 19, 20, 25, 28, 29, 32, 36, 41, 42, 47, 48, 51, 54, 63, 65, 71.

Step 2. With the help of FIG. 10, select a set of "target addresses" for each fault type, where the "target address" is an address to which a particular fault type can be moved without causing an increase in the number of multi-bit error words.

In the example, the following sets of addresses make the target address set for each fault type.

TARGET ADDRESS SET FOR CHIP KILL

1st Choice

{Row addresses with no fault} = {nil}

2nd Choice

{Row addresses with only cell kill faults or row addresses with no faults}
{2, 7, 12, 19, 20, 21, 26, 27, 28}

TARGET ADDRESS SET FOR BIT LINE KILL

1st Choice

{Row addresses with bit line kill or with bit line and cell kill}
{3, 4, 8, 11, 14, 15, 18, 30, 31}

2nd Choice

{Row addresses with bit line or cell kill}
{2, 3, 4, 7, 8, 11, 12, 14, 15, 18, 19, 20, 21, 26, 27, 28, 30, 31}

TARGET ADDRESS SET FOR WORD LINE KILL

1st Choice

{Row addresses with word line kill or with word line and cell kill}
{0, 1, 5, 10, 24, 29}

2nd Choice

{Row addresses with word line or cell kill}
{0, 1, 2, 5, 7, 10, 12, 19, 20, 21, 22, 24, 26, 27, 28, 29}

TARGET ADDRESS SET FOR CELL KILL

{2nd Choice target address set for bit line kill} or
{2nd Choice target address for set word line kill}
= {0, 1, 2, 3, 4, 5, 7, 8, 10, 11, 12, 14, 15, 18, 19, 20, 21, 22, 24, 26, 27, 28, 30, 31}.

In FIG. 8, there are no row addresses with zero faults and thus ideally there are no target addresses to which a chip kill can be moved. In such a situation the next best available target addresses can be the row addresses which have cell kill faults only. In the same way one would like to choose target addresses for bit line and word line kills as those addresses that already have bit line and word line fails respectively. In other words, a bit kill can be moved to row addresses containing a bit line kill and/or a cell kill only. Similarly, a word line kill can be moved to row addresses containing a word line kill or a cell fail only. This would enable to keep the target address set size approximately the same. This will be independent of the number of faults dispersed, and therefore will help to disperse more faults.

Step 3. For each section in the "work matrix" find a maximum mutually compatible permutation vector, by EXORing each fault-type address with the addresses in their respective "target set". For example, for section 8 of the "work matrix" with cell fails in row address 5 and 10 and a word line fail in row address 17, the maximum mutually compatible permutation vector is determined as follows:

[Addresses in the target set for cell kill]⊕[Address of the cell kills in section 8],

[Addresses in the target set for word line kill]⊕[Address of word line kill in section 8.]

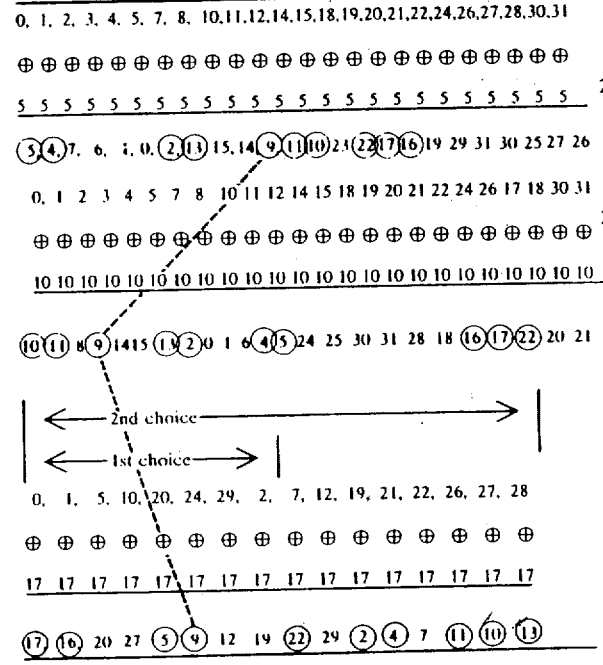

Here one can easily pick a set of permutation vectors which are not only maximum mutually compatible but rather completely (3-way) compatible. These are shown by circled entries. Any one of these will reduce the number of multiple bit error words. Therefore, algorithm picks one in a random fashion. A maximum mutually compatible permutation vector is not necessarily completely compatible, however a completely compatible permutation vector is always maximum mutually compatible. For example, suppose a completely compatible vector could not be found for section 8, the algorithm will search for a two-way compatibility. In such a situation, if there is more than one choice available, the algorithm will pick that permutation vector from the choice set which decreases the number of multi-bit error words to minimum. As the algorithm continues to operate from section to section, the target address sets are continuously updated. Once a fault pair is realigned, the algorithm automatically skips the 2nd section in the pair. These characteristics of the algorithm make it highly convergent.

Figure 12:
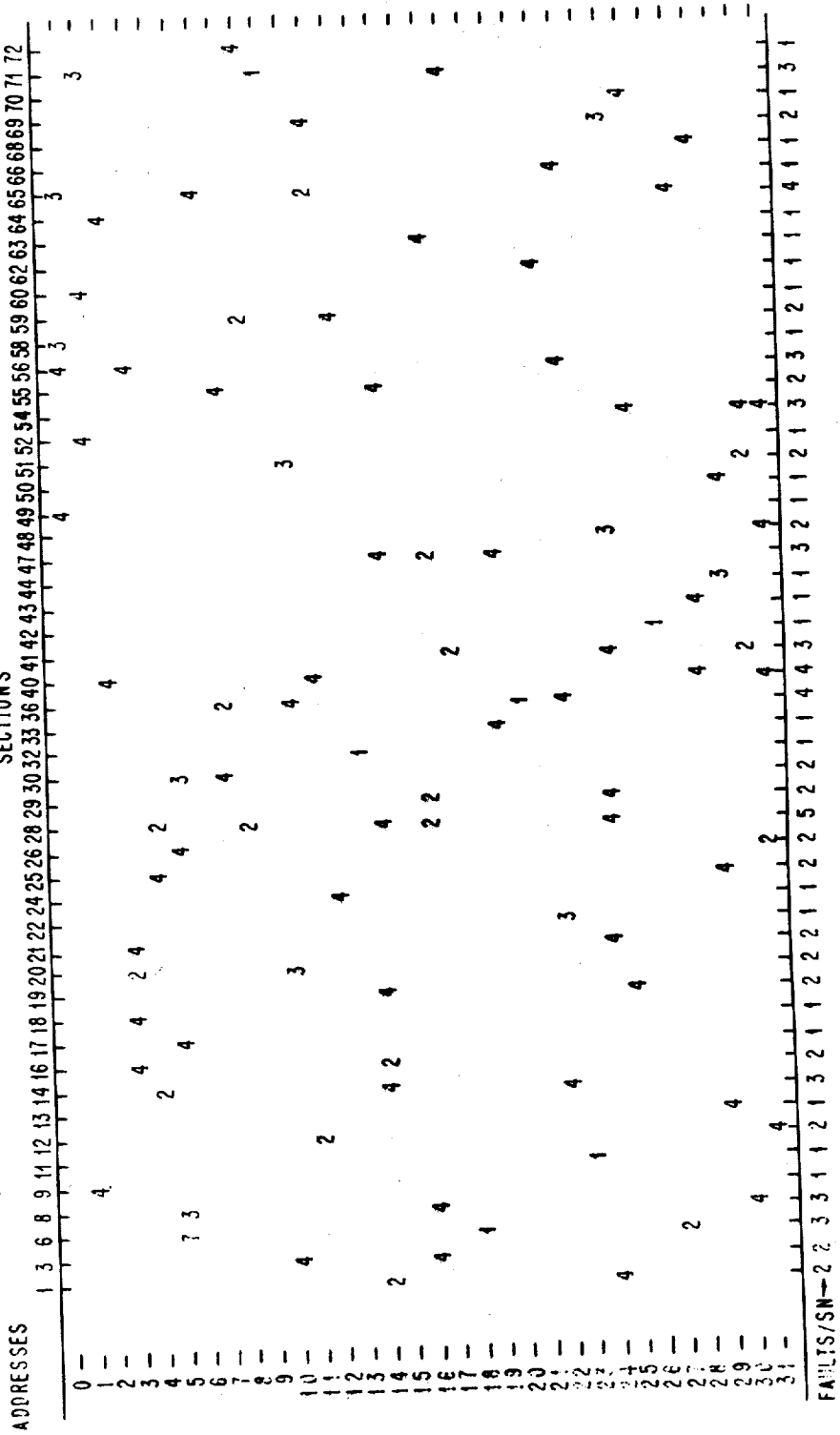

FIG. 12 and FIG. 13 show the final memory fault map and its corresponding error summary table after fault dispersion. The error column in FIG. 13 indicates 0s in every row address, implying that all the faults which caused two or more bit error memory words have been dispersed.

For the sake of completeness, it is worthwhile to describe a general approach for fault dispersion with the availability of a partial fault map only. The nature of the fault map may vary with the amount of information available about the fault types and their respective addresses within individual chips. For example, a fault map may only identify chip kill, line kill and cell kill, i.e. it does not provide any information if the line killed is a word line or bit line. On the other hand, a second fault map may identify chip kill, bit line kill, word line kill and cell kill type faults, but not the location of failed bit line, word line or cell within a chip. It is obvious that it will be less tedious and less time consuming to work with the second map, however, the general approach of using these maps must be the same.

The general approach has been to start with the available fault information and disperse all possible faults, as if all the bit line, word line and cell faults have different addresses within the individual chips. In other words, any two bit lines and cells can be bunched in any of the permutable row addresses. Similarly, any two word lines and cells can be bunched in any of the permutable row addresses. This is followed by reconfiguring the memory according to the values of permutation vector and testing for two or more bit error words. The addresses of the faulty words and the location of faulty bit within the words in the reconfigured memory provide the information about some of the fault types and their addresses not available earlier. With this new information, the fault map is updated and once again a new set of permutation vectors are found. Once again the memory is reconfigured and tested. This procedure is repeated until no multiple bit error words are found or the number of multi-bit error words cannot be further reduced.

The algorithm assumes the availability of fault map and its corresponding error summary of FIG. 9 and FIG. 11 respectively. The only difference is that the information provided in FIG. 10 and hence the list of permutation vectors to be excluded from the selection is not available to the algorithm. Based on this partial information and assuming that all bit line and word line and cell kill addresses are unique, the algorithm calculates a list of permutation vectors which must disperse all the faults to a new reconfigured memory map of FIG. 14 and its associated summary table of FIG. 15. These permutation vectors with their respective sections are listed as follows:

| Sections | 1, 6, 8,11,13,14,17,18,21,25,28,29,32,36,42,48,51,56 |
|---|---|
| Permutation Vectors | 7,20,20, 7, 7, 9 16 10 23 17  7 29 20  3 11 27 12 27 |

Figure 14:
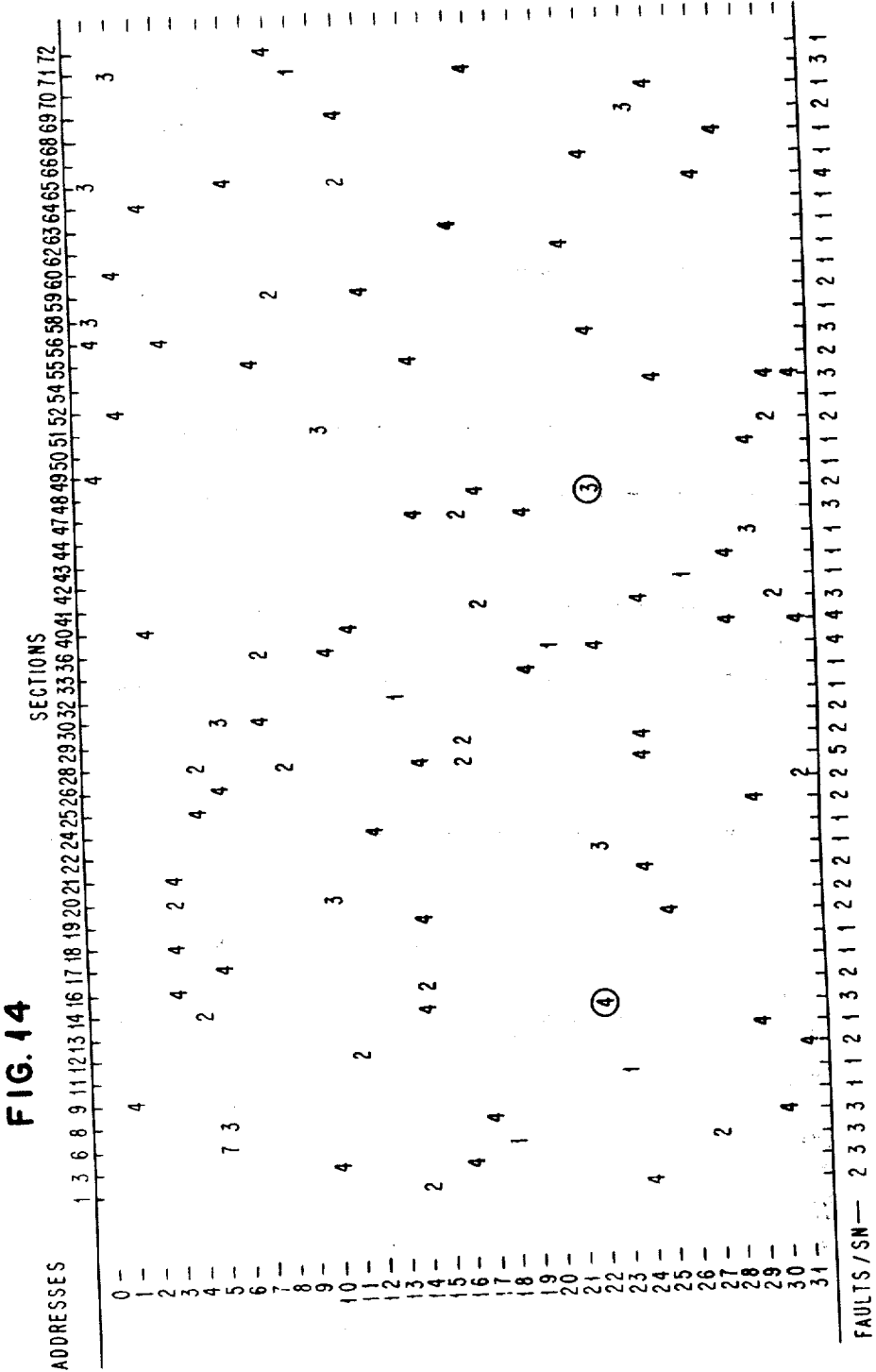

The reconfigured memory map of FIG. 14 when tested is found to contain one, two bit error words resulting from an alignment in row address 22 due to a cell kill in section 14 and a word line kill in section 48. The alignment resulted due to a common address component to a cell kill and word line kill. Therefore, permutation vector 9 and 27 for section 14 and 48 are not mutually acceptable. In this example, the algorithm finds another permutation vector 21 for section 48. The error summary table of FIG. 13 is used by the algorithm to disperse faults indicates there are zero UE's. This is because the table does not have cell and word addresses. This memory reconfiguration does not have any two bit or multi-bit errors in any of its memory words.

Although the step by step description of the method may give the appearance that the algorithm must proceed sequentially column by column in determining permutation vectors is not always necessary. Many sections can be simultaneously handled if they do not have chip kill faults and 1st choice "target addresses" sets for bit line, word line, and cell fails can meet maximum compatibility criterion. The other sections which either have chip kill or needs second choice "address target sets" and thus require an update on target address sets must require sequential operation. Such an approach can speed up algorithm execution up to 40% over a complete sequential operation.

Figure 16:
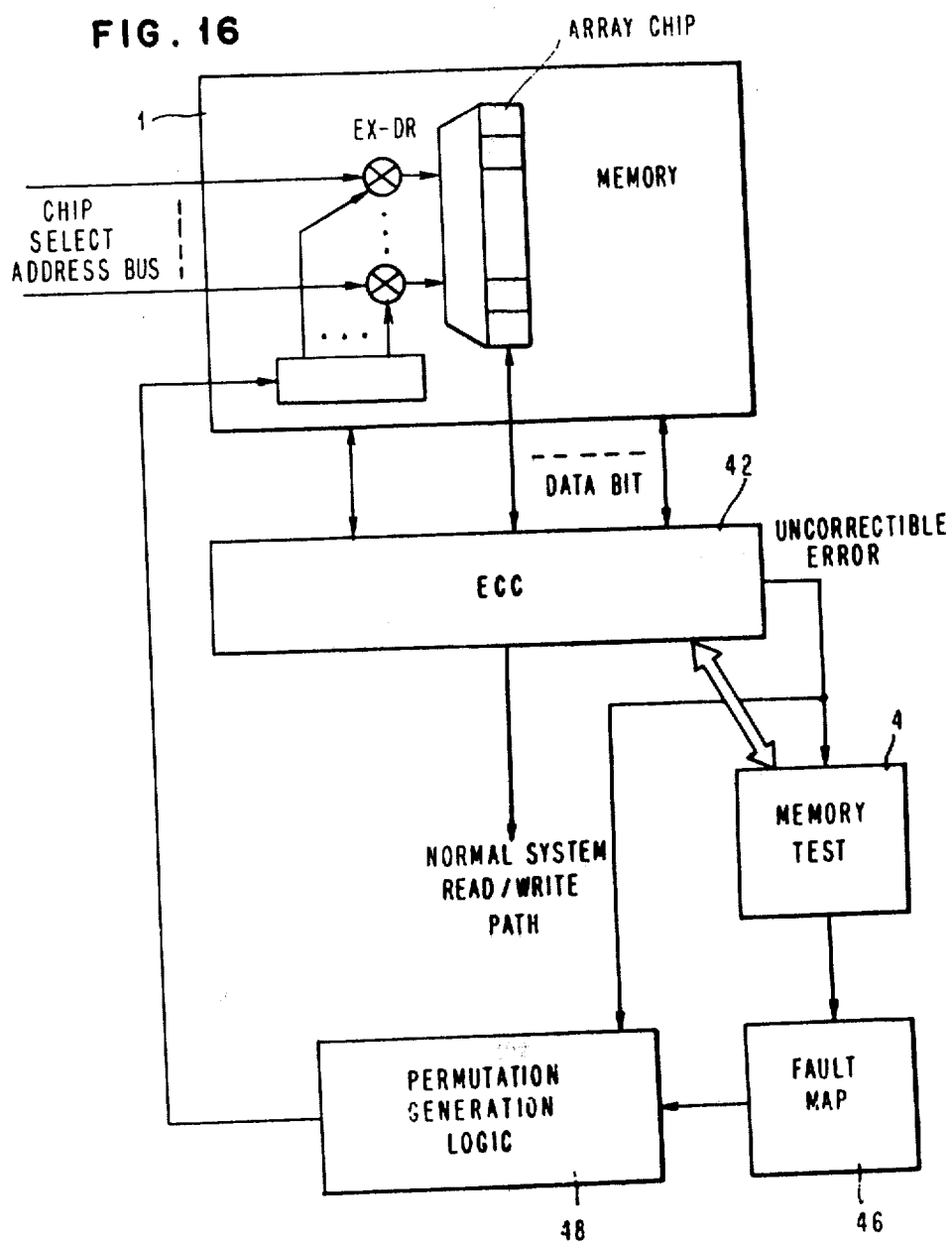
FIG. 16 is a block diagram of an error correcting system employing the present invention.

In FIG. 16 a memory 40 such as that shown in FIG. 1 is checked by conventional error correction apparatus 42. The occurrence of an uncorrectable error (UE) signal from the apparatus initiates testing of the memory array be tester 44. The tester is a device for application test patterns to the memory location containing the UE. For instance, the tester could apply a pattern of all 1's followed by a pattern of all zeros to the flawed memory location to determine bits stuck at 0 or 1 respectively.

When the faulty bits have been identified, their address is stored in memory in a fault map in the manner described in the present application or an other mapping suitable for the purpose. Generation of a fult map is described in U.S. patent application Ser. No. 345,944, filed Dec. 18, 1981, and entitled "Apparatus for High Speed Fault Mapping of Large Memories".

The UE condition also initiates operation of the permutation generation logic 48 to change data in the registers 34 of the memory to eliminate the UE condition. In accordance with the present invention, the permutation generator is a microcoded processor 48 capable of executing the algorithm set forth above.

The output of the permutation generator is the CR values for the various bit positions of the memory so these CR values are fed into the latches 34. The latches can be stages of an LSSD shift register. So the data could be shifted along the LSSD chain into the proper stages.

Two embodiments with a number of modifications have been described. Therefore it should be understood that many modifications and changes can be made in the illustrated embodiments without departing from the spirit and scope of the invention as represented in the attached claims.

```
▼ Z←ACONVERGE M;A;II;L;S;V;V1;NV;MV[35]    N[LC+1;EXM[L;1+NV])←N[L]
   1;SI;SP;IT;W;W1;A;A;UF;E;HS;EN;[36]     L←L[(LL+0)/1;LL←L[LC]
   PM1;LC;LL;EE;NO;W;WM;Q;TS;LP;IM;[37]    A[L]←0
   PM;PM0;W1;B[;CK;TSS;R          [38]    M[W5]←A
[1]  W IS FAULTMAP OF SIZE MS(64×144)      [39]    W←←/UF←FAULTS EN←ERROR N
[2]  MS ARE NONZERO SECTIONS               [40]    N ←((W=0)∨W=B59)/HAVEN
[3]  NII IS NO. OF ITERATIONS (SAY 3)      [41]    →(W=0)/HAVEN
[4]  NNN ARE THE PERMUTATION BITS(;N)      [42]    W1←W1,W
[5]  NFP  ARE THE FINAL PERM. VECTORS      [43]    CONT:→((;S);I←I+1)/LOOP
[6]  N W1 ARE ERROR WORDS LEFT             [44]    W11←W11,W1
[7]   II←3                                 [45]    SP←W11 SHORT SP
[8]  BEGIN:M←0                             [46]    W11←¯1↓W11[;L]
[9]   SP←SP1←(2 1)/ 1 0                    [47]    →(II;IT←IT+1)/START
[10]  W11←10                               [48]    W1←L/W1
[11] START:N←2●(;M)[1]                     [48.1]   →END
[12]  W1←W←←/UF←FAULTS EN←ERROR N          [48.2] HAVEN:W1←W←0
[13]   →(0=W1)/HAVEN                       [49]  END:FP←ARRANGE SP
[14]  S←SECTION M                          [50]    LA←N
[15]  I←1                                  [51]    Z←W1
[16] LOOP:SI←S[I]                                   ▼
[17]   L←(A;1)/;A←M[;WS←S;SI]
[18]   →(0=←/UF[L]>0)/CONT
[19]   TARGET EN
[20]   V←LOCATION SI
[21]   V1←←/(,V)..●;¯1+MS←(;M)[1]
[22]   V1←V1[;¯1+2×NN]
[23]   NV←(V1=NV1←⌈/V1)/;,V1
[24]   →(NV1<0.5×;L)/CONT
[25]   →(NV1<;L)/CHECK0
[26]   →((;NV)<2)/MOVE
[27]   NV←NV[1?;NV]
[28]   →MOVE
[29] CHECK0:NV←OPT NV
[30] N CHECK0:NV←OPTIMUM NV
[31]   →(ME;W)/CONT
[32] MOVE:
[33]   SP←SP,(2 1)/SI,NV
[34]   N[LC+1;L EXORPM 1+NV]←N[L]
```

```
    ∇ Z←ARRANGE SP;I;K;L;R;S;V;CB;MR;PM;PV;SS;S1;V1;N2;PM2
[1]   ⍝AVOID DUPLICATION IN SECTIONS AND THE CORRESPONDING PERM. VECTORS.
[2]   ⍝ARRANGE NON-ZERO SECTIONS IN ASCENDING ORDER
[3]   MR←⌈/R←SP[1;]
[4]   SS←+/R∘.=⍳MR
[5]   →(1=⌈/SS)/END
[6]   S1←(SS=1)/⍳⍴SS
[7]   S←(SS>1)/⍳⍴SS
[8]   I←1
[9]   PV←⍳0
[10] LOOP:L←(R=S[I])/⍳⍴R
[11]  V←(SP[2;])[L]
[12]  CB←2⊥+/(N2←⍴⍴2)⊤V
[13]  PV←PV,N2⊥CB
[14]  →((⍴S)≥I←I+1)/LOOP
[15]  PM2←(2,⍴S)⍴S,PV
[16]  K←(V1=1)/⍳⍴V1←R∊S1
[17]  PM←SP[;K],PM2
[18]  PM[1;]←(PM[1;])[K←⍋PM[1;]]
[19]  PM[2;]←(PM[2;])[K]
[20]  SP←PM
[21] END:S←(SP[2;]≠1)/⍳⍴SP[2;]
[22]  Z←SP[;S]
    ∇
    ∇ERROR[⎕]∇
    ∇ Z←ERROR MM;R
[1]   R←((⍴MM)[1],4)⍴0
[2]   R[;1]←+/MM=1
[3]   R[;2]←+/MM=2
[4]   R[;3]←+/MM=3
[5]   R[;4]←+/MM=4
[6]   Z←R
    ∇

∇EXORPM[⎕]∇
    ∇ Z←R EXORPM C;I;D;CB;BC;BR;N2;N
[1]   ⍝N IS NO. OF BITS
[2]   ⍝GENERATES EXOR PERMUTATION MATRIX,
[3]   ⍝FOR SPECIFIED ROWS AND COLUMNS.
[4]   ⍝FOR ENTIRE MATRIX, SET R←C←⍳2*N
[5]   N←2⊗(⍴M)[1]
[6]   BR←⌽(N2←N⍴2)⊤R-1
[7]   BC←⌽N2⊤C-1
[8]   →(0=⍴⍴R)/LN1
[9]   →(0=⍴⍴C)/LN2
[10]  I←1
[11]  D←((⍴R),⍴C)⍴0
[12] LN:CB←2|BC+(⍴BC)⍴BR[I;]
[13]  D[I;]←N2⊥CB
[14]  →((⍴R)≥I←I+1)/LN
[15]  →END
[16] LN1:D←N2⊥CB←2|BC+(⍴BC)⍴BR
[17]  →END
[18] LN2:D←N2⊥CB←2|BR+(⍴BR)⍴BC
[19] END:Z←D
    ∇

∇ Z←FAULTS M;R0;R1;RC;E21;E22;E1;E2;UF
[1]   UF←((⍴M)[1])⍴0
[2]   R0←(R1=1)/⍳⍴R1←M[;1]
[3]   RC←(R1>1)/⍳⍴R1
[4]   E1←M[R0;]
[5]   E1[;1]←E1[;1]-1
[6]   UF[R0]←+/((⍴E1)⍴ 0 256 256 1)×E1
[7]   E2←M[RC;]
[8]   E21←(⍴E2)⍴ 65536 256 256 1
[9]   E22←⊖(⍴⊖E2)⍴E2[;1]
[10]  E22[;1]←1
[11] ⍝ E2[;1]←E2[;1]-1
[12]  E2[;1]←1
[13]  UF[RC]←+/E2×E21×E22
[14]  UF←UF+M[;2]×M[;3]
[15] ⍝ UF[32]←0
[16]  Z←UF
    ∇

∇ Z←SECTION M;R;BL;BT;UF;EM
[1]   ⍝PROVIDE NECESSARY SECTIONS FOR BL
      WL CE AND CH IN ASCENDING ORDER
[2]   ⍝CORRESPONDING TO DIRTY ADDRESSES I
      N FAULTS COLUMN UF
[3]   ⍝REQUIRES EM MATRIX FROM ERROR PROG
      RAM
[4]   R←(UF>0)/⍳⍴UF←FAULTS EM←ERROR M
[5]   BL←(BT>0)/⍳⍴BT←+/M[R;]
[6]  ⍝ BT←+/M[;BL]≥1
[7]  ⍝ Z←S[BL[⍋BT]]
[8]   Z←S[BL]
    ∇
```

```
     ∇ SHORT[◻]∇
     ∇ Z←W1 SHORT SP;V;ME;S1;S2;SV
[1]  ACORRECTS SP AND UPDATES MATRIX M
[2]  AIN ACONVERGE PROG.,AFTER 1 ITERATI
     ON
[3]  L←W1;ME←L/W1
[4]  S2←(⍴SP)[2]
[5]  →(L=S2)/END
[6]  V←L+⍳S2-L
[7]  SV←SP[1;V]
[8]  S1←(S1=1)/⍳⍴S1←S≠SV
[9]  A S2←S[S1]
[10] M[;S1]←M[;S1]
[11] END:Z←SP[;⍳L]
     ∇

∇ TARGET EM;BL1;WL1;CE1;E
[1]  AFIND TARGET ADDRESSES FOR EACH TYP
     E FAIL
[2]  APURE CELL TARGETS
[3]  CT←(E=0)/⍳⍴E←+/EM[;;3]
[4]  ACHIP-KILL ADDRESSES
[5]  CK←(EM[;1]≥1)/⍳⍴EM[;1]
[6]  ACLEAR TARGETS    FOR CHIP-KILL
[7]  CH←(CH=0)/⍳⍴CH←+/EM
[8]  BW←CT[(BW=0)/⍳⍴BW←CT∈CH]
[9]  →((⍴CH)≥1)/CONT1
[10] CH←BW
[11] ATARGET FOR BIT-LINE KILLS
[12] CONT1:BL←(BL=0)/⍳⍴BL←+/EM[; 1 3]
[13] BL←BL[(BL1=0)/⍳⍴BL1←BL∈CH,BW]
[14] →((⍴BL)≥1)/CONT2
[15] BL←BW
[16] ATARGET FOR WORD-LINE KILLS
[17] CONT2:WL←(WL=0)/⍳⍴WL←+/EM[; 1 2]
[18] WL←WL[(WL1=0)/⍳⍴WL1←WL∈CH,BW]
[19] →((⍴WL)≥1)/CONT3
[20] WL←BW
[21] ATARGET FOR CELL-KILLS
[22] CONT3:CE←(CE=0)/⍳⍴CE←+/EM[;1]
[23] CE←CE[(CE1=0)/⍳⍴CE1←CE∈CH]
[24] ACOMMON ADDRESSES FOR BIT AND WORD
     FAILS
[25] A BW←BL[(BW=1)/⍳⍴BW←BL∈WL]
     ∇

∇ QEI[◻]∇
     ∇ Z←QEI MV;E;I;ER;L;LC;LL;@;L
[1]  ASELECT PERM. VEC. MV, GIVING MIN.
     UE
[2]  AUSE IN ACONVERGE OR INCONVERGE PRO
     G.
[3]  I←1
[4]  ER←10
[5]  LOOP:@←A
[6]  L←L
[7]  @[LC←1+EXM[L;1+MV[I]]]←@[LT
[8]  L1←L[(LL=0)/⍳⍴LL←L∈LC]
[9]  @[L1]←0
[10] M[;HS]←@
[11] E←+/FAULTS ERROR M
[12] ER←ER,E
[13] →((⍴MV)≥I←I+1)/LOOP
[14] ME←L/ER
[15] L1←(L1=1)/⍳⍴L1←ER∈ME
[16] M[;HS]←A
[17] Z←MV[1?⍴MV←MV[L1]]
     ∇
```

Having thus described our invention, what we claim is new and desire to secure by Letters Patent is:

1. In a memory system made up of logical data words each with bit positions accessed by the same logical address bits through separate permuting means which converts said logical address bits to actual address bits for a data bit on the basis of permutation bits that are selected to distribute faulty data bits among the logical data words, the method comprising:

comparing the actual address of each fault in each bit position with the logical address of a number of preferred word locations for placing a fault, selecting the permutation bit which places the most faults in preferred word locations.

2. The memory system of claim 1 wherein said comparison is an Exclusive ORing of the actual address of each of the faults with the logical address of each of the preferred word locations, and the selection is a choosing of the most common result of the permutation bit.

3. The memory system of claim 1 or 2 wherein the selecting of permutation bits starts with bit positions having the most faults conflicting with faults in other bit positions and proceeds in order of decreasing number of such conflicts.

4. The memory system of claim 3 wherein the preferred word locations include those word locations that have no faulty bits therein.

5. The memory system of claim 4 wherein the number of errors in a word is equal to the permuted bits whose logical address includes said memory word and unpermuted bits whose real address is said memory word.

6. In a memory system made up of logical data words each with bit positions accessed by the same logical address bits through separate permuting means which converts said logical address bits to actual address bits for a data bit on the basis of permutation bits that are selected to distribute faulty data bits among the logical data words, the method comprising:

comparing the actual address of each fault in each bit position with the logical address of a number of preferred word locations for placing a fault, selecting the permutation bit which places the most faults in preferred word locations, repeating the selecting and comparison steps until all uncorrectable errors are permuted.

* * * * *